US012317496B2

(12) United States Patent
Yang et al.

(10) Patent No.: US 12,317,496 B2
(45) Date of Patent: May 27, 2025

(54) MEMORY AND CONTROLLING METHOD THEREOF, MEMORY SYSTEM AND ELECTRONIC DEVICE

(71) Applicant: Yangtze Memory Technologies Co., Ltd., Hubei (CN)

(72) Inventors: Tao Yang, Hubei (CN); Dongxue Zhao, Hubei (CN); Wenxi Zhou, Hubei (CN); Zhiliang Xia, Hubei (CN)

(73) Assignee: Yangtze Memory Technologies Co., Ltd., Wuhan (CN)

(*) Notice: Subject to any disclaimer, the term of this patent is extended or adjusted under 35 U.S.C. 154(b) by 173 days.

(21) Appl. No.: 18/090,142

(22) Filed: Dec. 28, 2022

(65) Prior Publication Data

US 2024/0164105 A1 May 16, 2024

(30) Foreign Application Priority Data

Nov. 14, 2022 (CN) .......................... 202211431384.3

(51) Int. Cl.
| | |
|---|---|
| *H10B 43/35* | (2023.01) |
| *G11C 16/04* | (2006.01) |
| *H10B 41/27* | (2023.01) |
| *H10B 41/35* | (2023.01) |
| *H10B 43/27* | (2023.01) |

(52) U.S. Cl.
CPC ......... *H10B 43/35* (2023.02); *G11C 16/0483* (2013.01); *H10B 41/27* (2023.02); *H10B 41/35* (2023.02); *H10B 43/27* (2023.02)

(58) Field of Classification Search
CPC ........ H10B 43/35; H10B 43/27; H10B 41/27; H10B 41/35; G11C 16/0483; G11C 16/10
See application file for complete search history.

(56) References Cited

U.S. PATENT DOCUMENTS

| | | | |
|---|---|---|---|
| 2014/0355351 A1* | 12/2014 | Unno ................. | G11C 16/0483 365/185.17 |
| 2022/0293180 A1* | 9/2022 | Lee .................... | G11C 16/0483 |

* cited by examiner

*Primary Examiner* — Sultana Begum
(74) *Attorney, Agent, or Firm* — Oblon, McClelland, Maier & Neustadt, L.L.P.

(57) ABSTRACT

A memory, a controlling method thereof, a memory system and an electronic device are disclosed. The memory can include a semiconductor layer and a memory array disposed on the semiconductor layer. The memory array can include a plurality of memory strings connected with the same bit line. Each memory string can include a memory cell and a select cell connected on at least one side of the memory cell. The select cell can include a first kind of transistors with a first threshold voltage and a second kind of transistors with a second threshold voltage. The first kind of transistors can be connected with the second kind of transistors. The first threshold voltage can be different from the second threshold voltage. Different memory strings can be controlled to be on or off to realize selective controlling functions for a plurality of memory strings connected with the same bit line.

20 Claims, 6 Drawing Sheets

MEMORY AND CONTROLLING METHOD THEREOF, MEMORY SYSTEM AND ELECTRONIC DEVICE

CROSS-REFERENCE TO RELATED APPLICATIONS

This present disclosure claims the benefit of Chinese Patent Application No. 202211431384.3 filed on Nov. 14, 2022, which is incorporated herein by reference in its entirety.

TECHNICAL FIELD

The present disclosure relates to semiconductor technology field, particularly to a memory and a controlling method thereof, a memory system and an electronic device.

BACKGROUND

Significant improvements have been made in semiconductor production process as planar flash memories develop. However, in recent years, the development of planar flash memories has encountered various challenges: the physical limit, the existing developing technology limit and the storage electron density limit, etc. In order to address the difficulties encountered in planar flash memories and achieve lower production costs for unit memory cell, three-dimensional (3D) flash memory structures emerged. In the structure of a 3D NAND flash memory device, a plurality of gate layers and insulating layers stacked alternatively in the vertical direction are included and channel holes are formed in the stacked layers (or "stack"). Memory cell strings are formed in channel holes and gate layers in the stack serve as gate lines for each layer of memory cells, thereby implementing stacked 3D NAND flash memory devices.

At present, in the fabrication of the stack, due to the function demand, openings or grooves need to be made in the stack, which complicates the process and increases the difficulty, thereby drastically increasing the process time and the process cost.

SUMMARY

Implementations of the present disclosure provide a memory and a controlling method thereof, a memory system and an electronic device that can control on or off the memory strings in various regions by the select cells in the memory strings to simplify processes and reduce costs.

An implementation of the present disclosure provides a memory. For example, the memory can include a semiconductor layer and a memory array. The memory array can be disposed on the semiconductor layer and include a plurality of memory strings connected with a same bit line. Each of the memory strings can include a memory cell and a select cell connected on at least one side of the memory cell.

In an implementation, the select cell can include a first kind of transistors with a first threshold voltage and a second kind of transistors with a second threshold voltage, the first kind of transistors can be connected with the second kind of transistors, and the first threshold voltage can be different from the second threshold voltage.

In an implementation of the present disclosure, the memory strings can extend in a first direction perpendicular to the semiconductor layer, the select cell can be connected on at least one side of the memory cell in the first direction, and the first kind of transistors and the second kind of transistors are connected in the first direction.

In another implementation, the first kind of transistors can be turned on when their gate voltages are greater than the first voltage, the second kind of transistors are turned on when their gate voltages are greater than the second voltage, the first voltage is greater than the second voltage, the first threshold voltage is greater than the second voltage and less than the first voltage, and the second threshold voltage is less than the second voltage such that the plurality of the memory strings are selectively turned on by the select cells.

In one implementation of the present disclosure, the plurality of the memory strings can include one on-state memory string in turned-on state and other off-state memory strings in turned-off state, the first kind of transistors and the second kind of transistors in the on-state memory string are all turned on, and at least one of the first kind of transistors in the off-state memory strings are turned off.

In an implementation of the present disclosure, at least one of the first kind of transistors in the off-state memory strings and at least one of the second kind of transistors in the on-state memory string are connected with a same word line.

In one implementation of the present disclosure, the select cell is located between the semiconductor layer and the memory cell, and at least one top transistor and first grooves are disposed on a side of the memory cell away from the select cell.

In an implementation, the memory can include a plurality of memory sub-blocks arranged in a second direction parallel to the semiconductor layer, the memory sub-blocks can include a plurality of the memory strings, the first grooves are arranged between adjacent two of the memory sub-blocks in a third direction, and the third direction is parallel to the semiconductor layer and perpendicular to the second direction.

In one implementation of the present disclosure, the select cell is located on a side of the memory cell away from the semiconductor layer, the memory can further include at least one secondary transistor and second grooves disposed on a side of the select cell away from the memory cell, and the secondary transistor is connected on the side of the select cell away from the memory cell.

In an implementation, the memory can further include a plurality of memory sub-blocks arranged in a second direction parallel to the semiconductor layer, the memory sub-block can include a plurality of the memory strings, the second grooves are arranged between adjacent two of the memory sub-blocks in a third direction, and the third direction is parallel to the semiconductor layer and perpendicular to the second direction.

In one implementation of the present disclosure, the select cells can include first select cells located between the semiconductor layer and the memory cells and second select cells located on a side of the memory cell away from the semiconductor layer, the memory can further include at least one secondary transistor and second grooves disposed on a side of the second select cell away from the memory cell, and the secondary transistor is connected on the side of the second select cell away from the memory cell.

In an implementation, the memory can further include a plurality of memory sub-blocks arranged in a second direction parallel to the semiconductor layer, the memory sub-blocks can include a plurality of the memory strings, the second grooves are arranged between adjacent two of the memory sub-blocks in a third direction, and the third direction is parallel to the semiconductor layer and perpendicular to the second direction.

In one implementation of the present disclosure, a number of the plurality of memory strings connected with the same bit line is greater than $2^{n-1}$ and less than or equal to $2^n$, n is a positive integer greater than or equal to 1, and a sum of a number of the first kind of transistors and a number of the second kind of transistors in the select cells of the memory strings is greater than or equal to 2n.

In an implementation of the present disclosure, a number of the first kind of transistors in the select cells equals to a number of the second kind of transistors.

According to the above-described object of the present disclosure, an implementation of the present disclosure further provides a controlling method for a memory. For example, the memory can include a semiconductor layer and a memory array. The memory array can be disposed on the semiconductor layer and include a plurality of memory strings connected with a same bit line. Each of the memory strings can include a memory cell and a select cell connected on at least one side of the memory cell. The select cell can include a first kind of transistors with a first threshold voltage and a second kind of transistors with a second threshold voltage. The first kind of transistors can be connected with the second kind of transistors. The first threshold voltage can be different from the second threshold voltage. As another example, the controlling method can include applying different voltages to the first kind of transistors and the second kind of transistors to select and turn on a memory string as the driven memory string from the plurality of memory strings.

In one implementation of the present disclosure, the memory strings can extend in a first direction perpendicular to the semiconductor layer, the select cell is connected on at least one side of the memory cell in the first direction, and the first kind of transistors and the second kind of transistors are connected in the first direction. In an implementation, applying different voltages to the first kind of transistors and the second kind of transistors can include applying a first voltage to the first kind of transistors in the driven memory string, applying a second voltage to the second kind of transistors in the driven memory string, and applying the second voltage to at least one of the first kind of transistors in memory strings other than the driven memory string among the plurality of memory strings such that the driven memory string is an on-state memory string. The memory strings other than the driven memory string among the plurality of memory strings can be off-state memory strings, the first voltage can be greater than the second voltage, the first threshold voltage can be greater than the second voltage and less than the first voltage, and the second threshold voltage can be less than the second voltage.

In one implementation of the present disclosure, at least one of the first kind of transistors in the off-state memory strings and at least one of the second kind of transistors in the on-state memory string are connected with a same word line.

According to the above-described object of the present disclosure, an implementation of the present disclosure further provides a memory system. For example, the memory system can include the memory and a controller coupled to the memory and configured to control the memory to store data.

According to the above-described object of the present disclosure, an implementation of the present disclosure further provides an electronic device including the memory system.

With the memory and controlling method thereof, the memory system and the electronic device provided in implementations of the present disclosure, it is possible to control on or off of memory strings in different regions to realize selective controlling functions for a plurality of memory strings connected with the same bit line by providing a select cell connected with the memory cell in respective memory strings, which includes a first kind of transistors and a second kind of transistors, wherein the first threshold voltage of the first kind of transistors is different from that of the second kind of transistors, which allows the first kind of transistors and the second kind of transistors in different memory strings to be turned on or off by controlling different applied voltages for the first kind of transistors and the second kind of transistors in respective memory strings. It is also possible to simplify the process and reduce costs.

BRIEF DESCRIPTION OF ACCOMPANYING DRAWINGS

Technical solutions and other beneficial effects of the present disclosure will become apparent from the following detailed description of specific implementations of the present disclosure in connection with the accompanying drawings.

DETAILED DESCRIPTION

Figure 1:
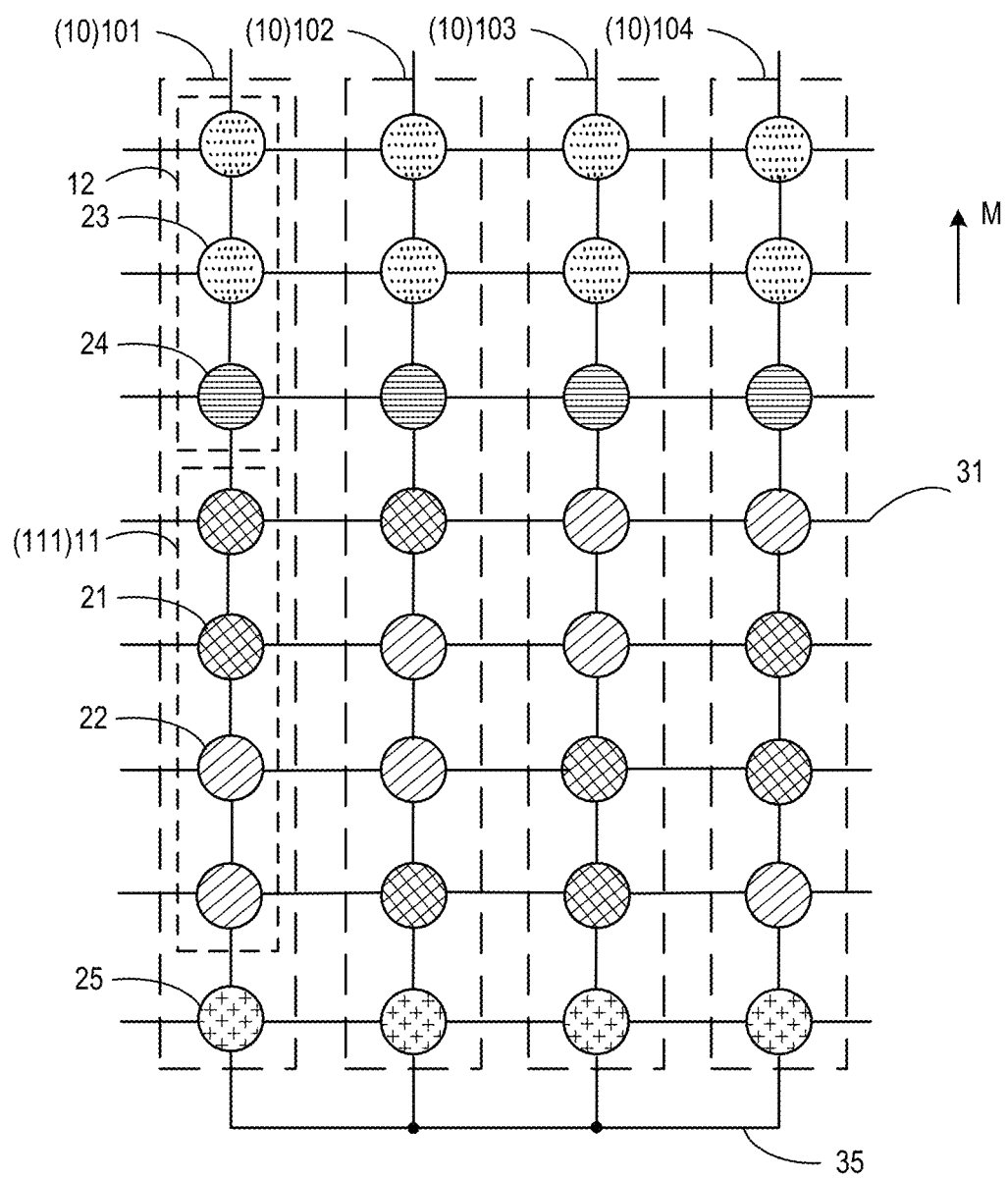
FIG. 1 is an equivalent circuit structure diagram of some memory strings in the memory provided in an implementation of the present disclosure.

The technical solutions in implementations of the present disclosure will be described clearly and fully below in connection with accompanying drawings in implementations of the present disclosure. Obviously, the described implementations are only a part of implementations of the present disclosure rather than all of them. Based on the implementations of the present disclosure, all other implementations obtained by those skilled in the art without any creative work fall within the scope of the present disclosure.

The disclosure below provides many different implementations or examples for implementing different structures of the present disclosure. In order to simplify the disclosure of the present disclosure, parts and arrangements of specific examples will be described below. Of course, they are only examples and not for limiting the present disclosure. Furthermore, the present disclosure may repeat reference numerals and/or letters in different examples, which is for the purpose of simplification and clarity rather than indicating relationships between the discussed implementations and/or arrangements. Furthermore, the present disclosure provides examples of various specific processes and materials. Those of ordinary skill in the art can recognize application of other processes and/or use of other materials.

An implementation of the present disclosure provides a memory including a semiconductor layer and a memory array disposed on the semiconductor layer.

Figure 2:
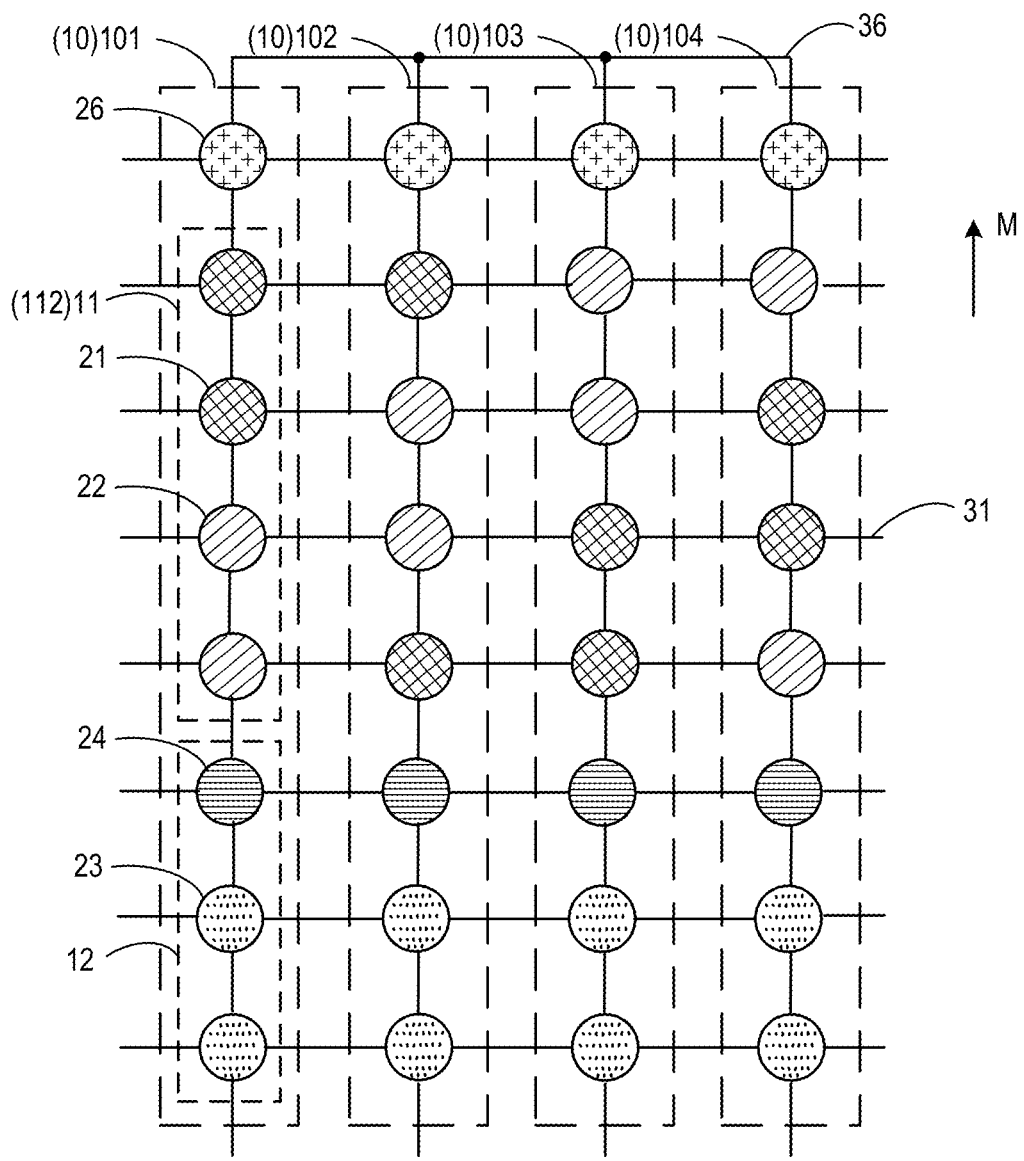
FIG. 2 is another equivalent circuit structure diagram of some memory strings in the memory provided in an implementation of the present disclosure.

Referring to FIGS. 1 and 2, the memory array includes a plurality of memory strings 10 connected with the same bit line 36. Each memory string 10 includes a memory cell 12 and a select cell 11 connected on at least one side of the memory cell 12.

The select cell 11 includes a first kind of transistors 21 with a first threshold voltage and a second kind of transistors 22 with a second threshold voltage. The first kind of transistors 21 is connected in series with the second kind of transistors 22 and the first threshold voltage is different from the second threshold voltage. That is, in implementations of the present disclosure, it is possible to control on or off of different memory strings to realize selective controlling functions for a plurality of memory strings 10 connected with the same bit line 36 by providing a select cell 11 connected with the memory cell 12 in respective memory strings 10, which includes a first kind of transistors 21 and a second kind of transistors 22 connected in series with the first kind of transistors 21, wherein the first threshold voltage of the first kind of transistors 21 is different from that of the second kind of transistors 22, which allows the first kind of transistors 21 and the second kind of transistors 22 in different memory strings 10 to be turned on or off by controlling different applied voltages for the first kind of transistors 21 and the second kind of transistors 22 in the respective memory strings 10.

While in related technology, bottom select gates at bottom and top select gates on the top layer are included in the stacked multiple layers of gates, and top select gates and bottom select gates are typically cut region by region in order to select a certain memory cell string for operation in the memory, which requires complex process and has a high difficulty, thereby drastically increasing the process time and process cost. Therefore, the implementations of the present disclosure may simplify process and reduce costs with respect to prior art.

In particular, referring to FIGS. 1 and 2, the memory includes a semiconductor layer and a memory array disposed on the semiconductor layer, wherein the semiconductor layer is not shown in figures and includes, but not limited to Si substrate, Ge substrate, SiGe substrate, Silicon on Insulator (SOI) substrate or Germanium on Insulator (GOI) substrate etc., and may be P-doped or N-doped.

The memory array includes a stack structure disposed on the semiconductor layer. The stack structure includes a plurality of gate layers and interlayer insulation layers stacked alternatively in the first direction M, which, in cooperation with a plurality of channel structures penetrating the stack structure in the first direction M, form a plurality of memory strings 10 in the memory array, the first direction M being the direction perpendicular to the semiconductor layer; wherein each gate layer and a portion of the channel structure passing through the gate layer may constitute a transistor and a plurality of the transistors are connected in series in the first direction M to form a memory string 10.

In prior art, a memory includes a plurality of memory strings. In order to individually control memory strings, it is typically to space apart top gates (top select gates) and bottom gates (bottom select gates) in the stack structure by for example providing separating grooves to implement region-wise controlling of the plurality of memory strings, which further in combination with different bit lines connecting memory strings in different regions, can achieve the selective controlling functions for the plurality of memory strings. However, the top and bottom of the stack structure need to be grooved in the prior art to space apart top gates and bottom gates in different regions. Particularly, grooving for the bottom of the stack structure is complicated and difficult, which will drastically increase process time and process cost.

Figure 3:
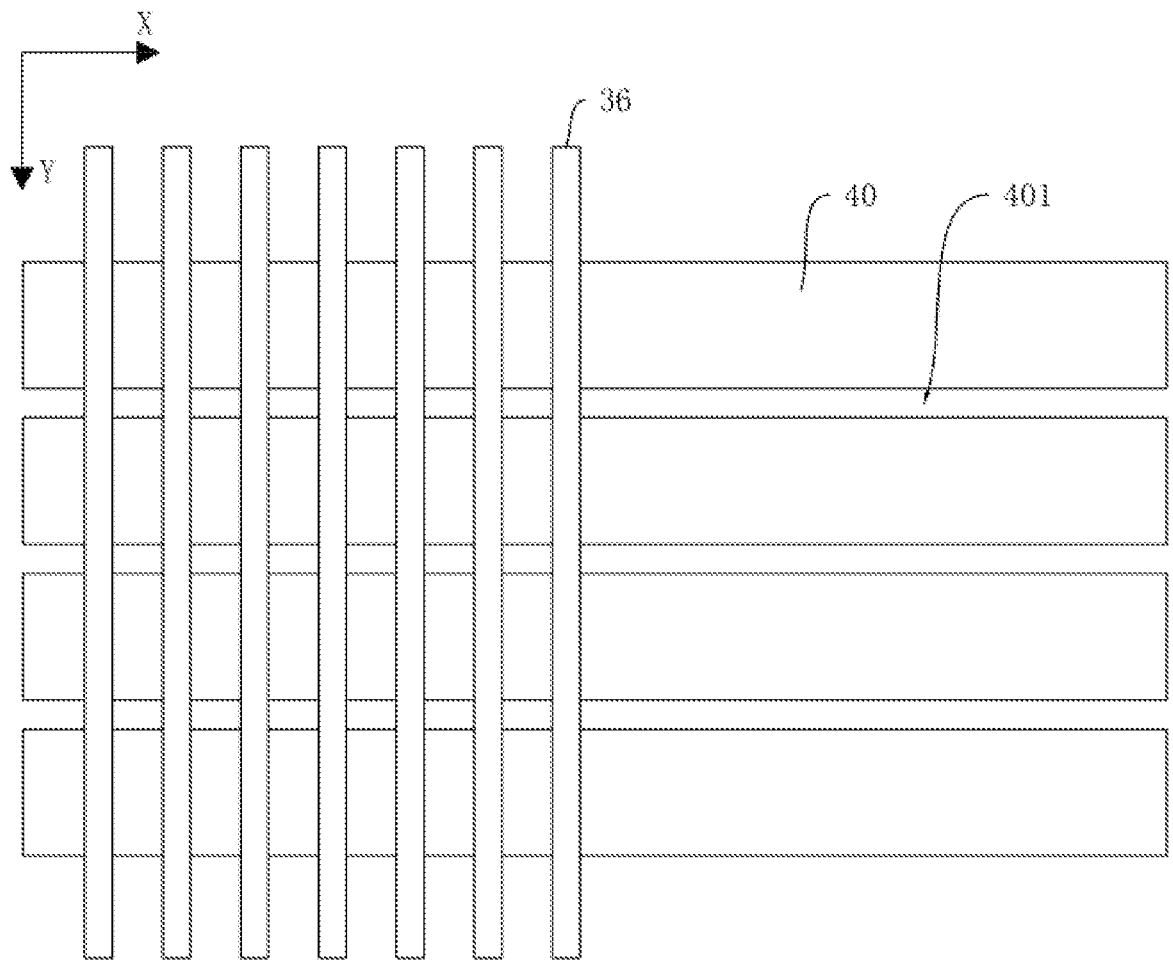
FIG. 3 is a structure top view of a memory provided in an implementation of the present disclosure.

In implementations of the present disclosure, referring to FIGS. 1, 2 and 3, the memory includes a plurality of memory blocks separated by gate slits, and each memory block includes a plurality of memory sub-blocks 40 arranged in the second direction Y parallel to the semiconductor layer, each including a plurality of memory strings 10. Additionally, the memory further includes a plurality of bit lines 36 arranged in the third direction X parallel to the semiconductor layer, wherein the third direction X is further perpendicular to the second direction Y and the bit lines 36 further extend in the second direction Y.

Wherein each bit line 36 connects one memory string 10 in respective memory sub-blocks 40, while different bit line 36 connects different memory strings 10 in the same memory sub-block 40.

Further, in an implementation of the present disclosure, each memory string 10 includes memory cells 12 arranged in the first direction M and select cells 11 connected on at least one sides of the memory cells 12 in the first direction M; and the select cells 11 may be turned on selectively to achieve alternative turning-on control of the plurality of memory strings 10 connected with the same bit line according to memory sub-blocks 40 by region.

Specifically, the memory cells 12 include a plurality of memory transistors 23 connected in the first direction M for storing data. The select cells 11 include a plurality of transistors connected on at least one side of the memory cells 12 in the first direction M, while the plurality of transistors include first kind of transistors 21 and second kind of transistors 22 connected in the first direction M, wherein the threshold voltage for the first kind of transistors 21 is the first threshold voltage, the threshold voltage for the second kind of transistors 22 is the second threshold voltage, the first kind of transistors 21 are turned on at a first voltage, the second kind of transistors 22 are turned on at a second voltage, the first voltage is greater than the second voltage, the first threshold voltage is smaller than the first voltage and greater than the second voltage, and the second threshold voltage is smaller than the second voltage.

In one implementation, the first threshold voltage may be greater than or equal to 1.5V and less than or equal to 4V, the second threshold voltage may be greater than or equal to −4V and less than or equal to 1V. For example, the first threshold voltage may be any one of 1.5V, 2V, 2.5V, 3V, 3.5V and 4V, while the second threshold voltage may be any one of −4V, −3V, −2V, −1V, 0V and 1V.

In one implementation, the memory cell 12 further includes at least one dummy memory transistor 24 connected between the memory transistor 23 and the select cell 11.

In implementations, the plurality of memory strings 10 connected with the same bit line 36 include one on-state memory string that is in turned-on state and other off-state memory strings that are in turned-off state. That is, the select cell 11 in on-state memory string is controlled to be turned on, and the select cells 11 in the off-state memory strings are turned off. Wherein, the first kind of transistors 21 and the second kind of transistors 22 in the on-state memory string are all turned on, at least the first kind of transistors 21 in the off-state memory strings are turned off to achieve alternative turning-on control of the plurality of memory strings 10 according to memory sub-blocks 40 by region.

It is to be noted that since the threshold voltage of the first kind of transistors 21 is greater than the threshold voltage of the second kind of transistors 22, it is further possible to set the first kind of transistors 21 in the off-state memory strings and the second kind of transistors 22 in the on-state memory string to be connected with the same word line 31, i.e., belonging to two different channel structures corresponding to the same gate layer. It is further possible to apply a second voltage to the word line 31 to turn on the second kind of transistors 22 in the on-state memory string, while the first kind of transistors 21 in the off-state memory strings are not turned on. Therefore, while the on-state memory string is in turned-on state, the off-state memory strings are in turned-off state.

Figure 4:
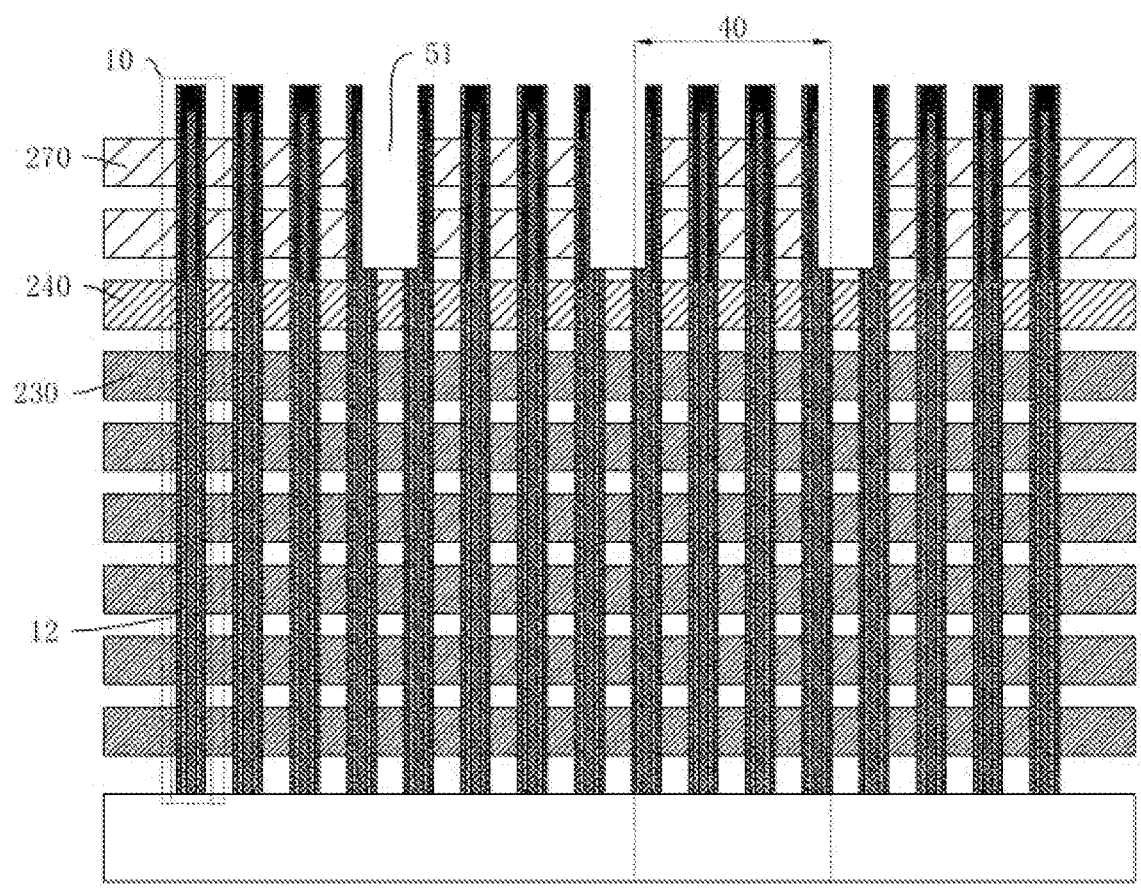
FIG. 4 is a sectional structure view of a memory provided in an implementation of the present disclosure.

In an implementation of the present disclosure, referring to FIGS. 1, 3 and 4, the select cells 11 are disposed between the semiconductor layer and the memory cells 12 and each memory block includes four memory sub-blocks 40 arranged in the second direction Y. Wherein each select cell 11 includes four transistors connected on one side of the memory cell 12 proximate to the semiconductor layer in the first direction M, specifically, two of the first kind of transistors 21 and two of the second kind of transistors 22.

The four memory sub-blocks 40 include four memory strings 10 connected with the same bit line 36, specifically, the first memory string 101, the second memory string 102, the third memory string 103 and the fourth memory string 104 as shown in FIG. 1 and arranged from left to right.

As can be seen in FIG. 1, in the first direction M and from bottom to top, the first transistor of the first memory string 101, the first transistor of the second memory string 102, the first transistor of the third memory string 103 and the first transistor of the fourth memory string 104 are disposed oppositely and connected with the same word line 31, the second transistor of the first memory string 101, the second transistor of the second memory string 102, the second transistor of the third memory string 103 and the second transistor of the fourth memory string 104 are disposed oppositely and connected with the same word line 31, the third transistor of the first memory string 101, the third transistor of the second memory string 102, the third transistor of the third memory string 103 and the third transistor of the fourth memory string 104 are disposed oppositely and connected with the same word line 31, and the fourth transistor of the first memory string 101, the fourth transistor of the second memory string 102, the fourth transistor of the third memory string 103 and the fourth transistor of the fourth memory string 104 are disposed oppositely and connected with the same word line 31.

The first one of transistors of the first memory string 101 is a second kind of transistor 22, the second one is a second kind of transistor 22, the third one is a first kind of transistor 21 and the fourth one is a first kind of transistor 21, the first one of transistors of the second memory string 102 is a first kind of transistor 21, the second one is a second kind of transistor 22, the third one is a second kind of transistor 22 and the fourth one is a first kind of transistor 21, the first one of transistors of the third memory string 103 is a first kind of transistor 21, the second one is a first kind of transistor 21, the third one is a second kind of transistor 22 and the fourth one is a second kind of transistor 22, and the first one of transistors of the fourth memory string 104 is a second kind of transistor 22, the second one is a first kind of transistor 21, the third one is a first kind of transistor 21 and the fourth one is a second kind of transistor 22.

It is to be noted that the plurality of transistors of the above-described four memory strings 10 are arranged as follows.

In the first direction M and from bottom to top, the first kind of transistor 21 that is the first in the second memory string 102 and the second kind of transistor 22 that is the first in the first memory string 101 are connected with the same word line 31, the first kind of transistor 21 that is the first in the third memory string 103 and the second kind of transistor 22 that is the first in the first memory string 101 are connected with the same word line 31, the first kind of transistor 21 that is the second in the third memory string 103 and the second kind of transistor 22 that is the second in the first memory string 101 are connected with the same word line 31, and the first kind of transistor 21 that is the second in the fourth memory string 104 and the second kind of transistor 22 that is the second in the first memory string 101 are connected with the same word line 31.

In addition, in the first direction M and from bottom to top, the first kind of transistor 21 that is the third in the first memory string 101 and the second kind of transistor 22 that is the third in the second memory string 102 are connected with the same word line 31, the first kind of transistor 21 that is the second in the third memory string 103 and the second kind of transistor 22 that is the second in the second memory string 102 are connected with the same word line 31, the first kind of transistor 21 that is the second in the fourth memory string 104 and the second kind of transistor 22 that is the second in the second memory string 102 are connected with the same word line 31, and the first kind of transistor 21 that is the third in the fourth memory string 104 and the second kind of transistor 22 that is the third in the second memory string 102 are connected with the same word line 31.

In the first direction M and from bottom to top, the first kind of transistor 21 that is the third in the first memory string 101 and the second kind of transistor 22 that is the third in the third memory string 103 are connected with the same word line 31, the first kind of transistor 21 that is the fourth in the first memory string 101 and the second kind of transistor 22 that is the fourth in the third memory string 103 are connected with the same word line 31, the first kind of transistor 21 that is the fourth in the second memory string 102 and the second kind of transistor 22 that is the fourth in the third memory string 103 are connected with the same word line 31, and the first kind of transistor 21 that is the third in the fourth memory string 104 and the second kind of transistor 22 that is the third in the third memory string 103 are connected with the same word line 31.

In the first direction M and from bottom to top, the first kind of transistor 21 that is the fourth in the first memory string 101 and the second kind of transistor 22 that is the fourth in the fourth memory string 104 are connected with the same word line 31, the first kind of transistor 21 that is the first in the second memory string 102 and the second kind of transistor 22 that is the first in the third memory string 103 are connected with the same word line 31, the first kind of transistor 21 that is the fourth in the second memory string 102 and the second kind of transistor 22 that is the fourth in the third memory string 103 are connected with the same word line 31, and the first kind of transistor 21 that is the first in the third memory string 103 and the second kind of transistor 22 that is the first in the fourth memory string 104 are connected with the same word line 31.

While driving the memory, for example while the first memory string 101 is selected to be turned on, a first voltage is applied to the word line 31 connected with the first kind of transistor 21 in the first memory string 101, a second voltage is applied to the word line 31 connected with the second kind of transistor 22 in the first memory string 101, such that the first memory string 101 is turned on, while the first kind of transistor 21 in the second memory string 102, the first kind of transistor 21 in the third memory string 103 and the first kind of transistor 21 in the fourth memory string 104 connected with the same word line 31 as the second kind of transistor 22 in the first memory string 101 cannot be turned on due to the applied low second voltage. Therefore, all the second memory string 102, the third memory string 103 and the fourth memory string 104 cannot be turned on.

Furthermore, the memory further includes at least one top transistor and a first groove 51 disposed at one side of the memory cell 12 away from the select cell 11, wherein the top transistor is connected with the top select gate 270, the selective turning-on function may be implemented via the select cell 11 on one side of the memory cell 12 proximate to the semiconductor layer, while the selective turning-on function is implemented via the top transistor on the side of the memory cell 12 away from the semiconductor layer.

In particular, the top select gate 270 is divided into a plurality of regions by the first grooves 51, that is, a plurality of memory sub-blocks 40 are divided in the memory array. That is, the first grooves 51 are distributed in spacer regions 401 between adjacent two memory sub-blocks 40 in the third direction X. Further in combination with each bit line 36 connecting one memory string 10 of one memory sub-block 40, it is possible to implement the function of selective controlling of turning on.

The first grooves 51 separate the top select gates 270, while memory gates 230 of the memory transistors 23 and dummy memory gates 240 of the dummy memory transistors 24 are not separated and remain to transmit signals among the plurality of memory sub-blocks 40.

Further, the memory may further include erasing transistors 25 between select cells 11 and the semiconductor layer and source lines 35 connecting erasing transistors 25 of respective memory strings 10. For example, two approaches may be adopted, including the gate induced drain leakage (GIDL) erase and the bulk erase. As for GIDL erasure, hole pairs are injected into the conductive channel by generating potential differences with respect to the N wells, thereby erasing the memory cells 12.

As described above, in implementations of the present disclosure, it is possible to control on or off of different memory strings 10 to realize selective controlling functions for a plurality of memory strings 10 connected with the same bit line 36 by providing a select cell 11 connected with the memory cell 12 in respective memory strings 10, which includes a first kind of transistors 21 and a second kind of transistors 22, wherein the first threshold voltage of the first kind of transistors 21 is different from that of the second kind of transistors 22, which allows the first kind of transistors 21 and the second kind of transistors 22 in different memory strings 10 to be turned on or off by controlling different applied voltages for the first kind of transistors 21 and the second kind of transistors 22 in respective memory strings 10. It is also possible to simplify the process and reduce costs.

Figure 5:
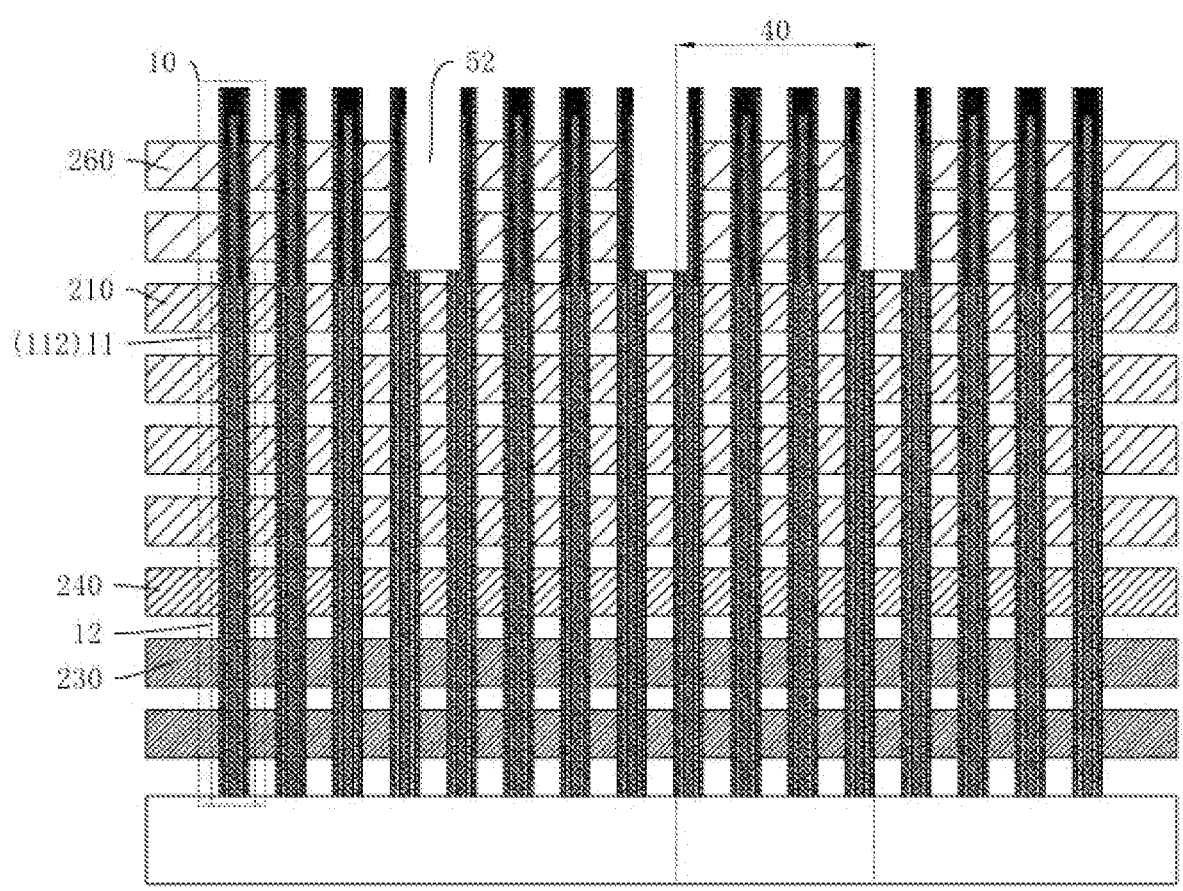
FIG. 5 is another sectional structure view of a memory provided in an implementation of the present disclosure.

In another implementation of the present disclosure, referring to FIGS. 2, 3 and 5, the present implementation is different from the preceding implementation in that the select cells 11 are disposed on one side of the memory cells 12 away from the semiconductor layer. The arrangement of the plurality of transistors in the select cells 11 can referred to the preceding implementation, which will not be described any more here.

It is to be noted that in this implementation, the memory further includes at least one secondary transistor 26 and second grooves 52 disposed on one side of the select cells 11 away from the memory cells 12, and the secondary transistors 26 being connected at one side of the select cells 11 away from the memory cells 12.

The second grooves 52 are arranged between two adjacent memory sub-blocks 40 in the third direction X. The second grooves 52 separate the secondary select gates 260 corresponding to the secondary transistors 26, while select gates 210 of the transistors, memory gates 230 of the memory transistors 23 and dummy memory gates 240 of the dummy memory transistors 24 are not separated and remain to transmit signals among the plurality of memory sub-blocks 40.

It is to be noted that the secondary transistors 26 and the second grooves 52 may be configured to adjust threshold voltages of transistors in select cells 11 after the memory fabrication to implement the transistor arrangement in the preceding implementation, which may be illustrated in detail in following implementations. And the secondary transistors 26 remain normally on in the driving process of the memory.

As described above, in implementations of the present disclosure, it is possible to control on or off of different memory strings to realize selective controlling functions for a plurality of memory strings 10 connected with the same bit line 36 by providing a select cell to 11 connected with the memory cell 12 in respective memory strings 10, which includes a first kind of transistors 21 and a second kind of transistors 22, wherein the first threshold voltage oft the first kind of transistors 21 is different from that of the second kind of transistors 22, which allows the first kind of transistors 21 and the second kind of transistors 22 in different memory strings 10 to be turned on or off by controlling different applied voltages for the first kind of transistors 21 and the second kind of transistors 22 in respective memory strings 10. It is also possible to simplify the process and reduce costs.

In another implementation of the present disclosure, with reference to FIGS. 1, 2, 3 and 5, the present implementation is different from the first implementation in that the select cells 11 include first select cells 111 disposed between memory cells 12 and the semiconductor layer and second select cells 112 disposed on the side of memory cells 12 away from the semiconductor layer, wherein the plurality of transistors in the first select cells 111 and the plurality of transistors in the second select cells 112 may be arranged with reference to the arrangement of the plurality of transistors in the select cells 11 in the first implementation.

Furthermore, the memory further includes at least one secondary transistor 26 and second grooves 52 disposed on the side of the select cells 11 away from the memory cells 12, and the secondary transistors 26 are connected at the side of the select cells 11 away from the memory cells 12.

The second grooves 52 are arranged between two adjacent memory sub-blocks 40 in the third direction X. The second grooves 52 separate the secondary select gates 260 corresponding to the secondary transistors 26, while select gates 210 of the transistors, memory gates 230 of the memory transistors 23 and dummy memory gates 240 of the dummy memory transistors 24 are not separated and remain to transmit signals among the plurality of memory sub-blocks 40.

It is to be noted that the secondary transistors 26 and the second grooves 52 may be configured to adjust threshold voltages of transistors in select cells 11 after the memory fabrication to implement the transistor arrangement in the preceding implementation, which may be illustrated in detail in following implementations. And the secondary transistors 26 remain normally on in the driving process of the memory.

As described above, in implementations of the present disclosure, it is possible to control on or off of different memory strings to realize selective controlling functions for a plurality of memory strings 10 connected with the same bit line 36 by providing a select cell 11 connected with the memory cell 12 in respective memory strings 10, which includes a first to kind of transistors 21 and a second kind of transistors 22, wherein the first threshold voltage oft the first kind of transistors 21 is different from that of the second kind of transistors 22, which allows the first kind of transistors 21 and the second kind of transistors 22 in different memory strings 10 to be turned on or off by controlling different applied voltages for the first kind of transistors 21 and the second kind of transistors 22 in respective memory strings 10. It is also possible to simplify the process and reduce costs.

It is to be noted that the number of transistors in select cells 11 is associated with the number of memory strings 10 connected with the same bit line 36, wherein the number of the plurality of memory strings 10 connected with the same bit line 36 is greater than $2^{n-1}$ and less than or equal to $2^n$, n is a positive integer greater than or equal to 1, and the sum of the number of first kind of transistors 21 and the number of the second kind of transistors 22 in select cells 11 of the respective memory strings 10 is greater than or equal to 2n.

In an implementation, the number of the first kind of transistors 21 in each select cell 11 equals to the number of the second kind of transistors 22.

In addition, an implementation of the present disclosure further provides a manufacturing method of the above-described memory. Referring to FIGS. 1, 2, 3 and 5, the method includes forming a stack on the semiconductor layer, wherein the stack includes a plurality of gate layers and interlayer insulation layers stacked alternatively in the first direction M, which, in cooperation with a plurality of channel structures penetrating the stack structure in the first direction M, form a plurality of memory strings 10 in the memory array, and the first direction M being the direction perpendicular to the semiconductor layer; wherein each gate layer and a portion of the channel structure penetrating the gate layer may constitute a transistor, while the plurality of transistors are connected in series in the first direction M to form a memory string 10.

It is further possible to form the second grooves 52 in at least one gate layers proximate to the top of the stack structure, i.e. the secondary select gate 260 to divide the secondary select gate 260 into a plurality of regions, i.e., corresponding to a plurality of memory sub-blocks 40 in the memory.

It is to be noted that it is possible to set in advance that each of the memory strings 10 includes memory cells 12 in the middle and select cells 11 on at least one side of the memory cells 12, that is, including the first select cells 111 between the memory cells 12 and the semiconductor layer and the second select cells 112 on the side of the memory cells 12 away from the semiconductor layer.

Next, in combination with the bit line 36, secondary select gates 260 in memory strings 10 are selectively applied with voltages to turn on the plurality of memory strings 10 alternatively, and transistors in select cells 11 of the turned-on memory strings 10 are programmed with incremental step pulses to adjust threshold voltages of transistors in the select cells 11 such that first kind of transistors 21 with the first threshold voltage and second kind of transistors 22 with the second threshold voltage are formed in the select cells. In particular, the locations, numbers and arrangements of the first kind of transistors 21 and the second kind of transistors 22 formed in the select cells 11 may be referred to the above-described implementations.

It is to be noted that after completing the settings of threshold voltages of transistors in select cells 11, while driving the memory, it is possible to keep the secondary transistors 26 in normally on state and to implement alternative turning-on function for the plurality of memory strings 10 by the select cells 11.

Further, an implementation of the present disclosure further provides a controlling method for the memory described in the above-described implementations. With reference to FIGS. 1, 2, 3 and 5, the controlling method for the memory includes:

applying different voltages to the first kind of transistors 21 and the second kind of transistors 22 to select and turn on a memory string 10 as the driven memory string from the plurality of memory strings 10.

Specifically, the implementation of the present disclosure will be described with respect to an example in which the select cells 11 are disposed on both sides of the memory cells 12, that is, the select cells 11 include first select cells 111 disposed between memory cells 12 and the semiconductor layer and second select cells 112 disposed on one sides of memory cells 12 away from the semiconductor layer.

It is appreciated that since the arrangement of the plurality of transistors in the first select cells 111 and the second select cells 112, one of them will be described below as an example.

One of the plurality of memory strings 10 is selected as the driven memory string, the first kind of transistors 21 in the driven memory string are applied with the first voltage, the second kind of transistors 22 in the driven memory string are applied with the second voltage, at least one the first kind of transistors 21 in other memory strings 10 other than the driven memory string among the plurality of memory strings 10 are applied with the second voltage such that the driven memory string is an on-state memory string, and the other memory strings 10 other than the driven memory string among the plurality of memory strings 10 are off-state memory strings, wherein the first voltage is greater than the second voltage, the first threshold voltage is greater than the second voltage and less than the first voltage, and the second threshold voltage is less than the second voltage.

In one implementation, the first threshold voltage may be greater than or equal to 1.5V and less than or equal to 4V, the second threshold voltage may be greater than or equal to −4V and less than or equal to 1V. For example, the first threshold voltage may be any one of 1.5V, 2V, 2.5V, 3V, 3.5V and 4V, while the second threshold voltage may be any one of −4V, −3V, −2V, −1V, 0V and 1V.

In particular, as shown in FIG. 1 or 2, for example, the first memory string 101 is selected as the driven memory string, then the first kind of transistors 21 in the first memory strings 101 are applied with the first voltage and the second kind of transistors 22 in the first memory strings 101 are applied with the second voltage.

Furthermore, in the first direction M and from bottom to top, since the first kind of transistor 21 that is the first in the second memory string 102 and the second kind of transistor 22 that is the first in the first memory string 101 are connected with the same word line 31, the first kind of transistor 21 that is the first in the third memory string 103 and the second kind of transistor 22 that is the first in the first memory string 101 are connected with the same word line 31, the first kind of transistor 21 that is the second in the third memory string 103 and the second kind of transistor 22 that is the second in the first memory string 101 are connected with the same word line 31, and the first kind of transistor 21 that is the second in the fourth memory string 104 and the second kind of transistor 22 that is the second in the first memory string 101 are connected with the same word line 31, that is, the first kind of transistor 21 that is the first in the second memory string 102, the two first kind of transistors 21 that are the first and second in the third memory string 103 and the first kind of transistor 21 that is the second in the fourth memory string 104 are all applied with the second voltage, such that the second memory string 102, the third memory string 103 and the fourth memory string 104 are all off-state memory strings, i.e., in the off state.

Similarly, the second memory string 102, or the third memory string 103 or the fourth memory string 104 may be turned on alternatively according to the above-described driving process with details as follows.

When the second memory string 102 is selected as the driven memory string, then the first kind of transistors 21 in the second memory strings 102 are applied with the first voltage and the second kind of transistors 22 in the second memory strings 102 are applied with the second voltage.

In the first direction M and from bottom to top, since the first kind of transistor 21 that is the third in the first memory string 101 and the second kind of transistor 22 that is the third in the second memory string 102 are connected with the same word line 31, the first kind of transistor 21 that is the second in the third memory string 103 and the second kind of transistor 22 that is the second in the second memory string 102 are connected with the same word line 31, the first kind of transistor 21 that is the second in the fourth memory string 104 and the second kind of transistor 22 that is the second in the second memory string 102 are connected with the same word line 31, and the first kind of transistor 21 that is the third in the fourth memory string 104 and the second kind of transistor 22 that is the third in the second memory string 102 are connected with the same word line 31, that is, the first kind of transistor 21 that is the third in the first memory string 101, the first kind of transistor 21 that is the second in the third memory string 103, and the two first kind of transistors 21 that are the second and third in the fourth memory string 104 are all applied with the second voltage, such that the first memory string 101, the third memory string 103 and the fourth memory string 104 are all off-state memory strings, namely in the off state.

When the third memory string 103 is selected as the driven memory string, then the first kind of transistors 21 in the third memory strings 103 are applied with the first voltage and the second kind of transistors 22 in the third memory strings 103 are applied with the second voltage.

In the first direction M and from bottom to top, since the first kind of transistor 21 that is the third in the first memory string 101 and the second kind of transistor 22 that is the third in the third memory string 103 are connected with the same word line 31, the first kind of transistor 21 that is the fourth in the first memory string 101 and the second kind of transistor 22 that is the fourth in the third memory string 103 are connected with the same word line 31, the first kind of transistor 21 that is the fourth in the second memory string 102 and the second kind of transistor 22 that is the fourth in the third memory string 103 are connected with the same word line 31, and the first kind of transistor 21 that is the third in the fourth memory string 104 and the second kind of transistor 22 that is the third in the third memory string 103 are connected with the same word line 31, that is, the two first kind of transistors 21 that are the third and fourth in the first memory string 101, the first kind of transistor 21 that is the fourth in the second memory string 102 and the first kind of transistor 21 that is the third in the fourth memory string 104 are all applied with the second voltage, such that the first memory string 101, the second memory string 102 and the fourth memory string 104 are all off-state memory strings, i.e., in the off state.

When the fourth memory string 104 is selected as the driven memory string, then the first kind of transistors 21 in the fourth memory strings 104 are applied with the first voltage and the second kind of transistors 22 in the fourth memory strings 104 are applied with the second voltage.

In the first direction M and from bottom to top, since the first kind of transistor 21 that is the fourth in the first memory string 101 and the second kind of transistor 22 that is the fourth in the fourth memory string 104 are connected with the same word line 31, the first kind of transistor 21 that is the first in the second memory string 102 and the second kind of transistor 22 that is the first in the third memory string 103 are connected with the same word line 31, the first kind of transistor 21 that is the fourth in the second memory string 102 and the second kind of transistor 22 that is the fourth in the third memory string 103 are connected with the same word line 31, and the first kind of transistor 21 that is the first in the third memory string 103 and the second kind of transistor 22 that is the first in the fourth memory string 104 are connected with the same word line 31, that is, the first kind of transistor 21 that is the fourth in the first memory string 101, the two first kind of transistors 21 that are the first and fourth in the second memory string 102 and the first kind of transistor 21 that is the first in the third memory string 103 are all applied with the second voltage, such that the first memory string 101, the second memory string 102 and the third memory string 103 are all off-state memory strings, i.e., in the off state.

Figure 6:
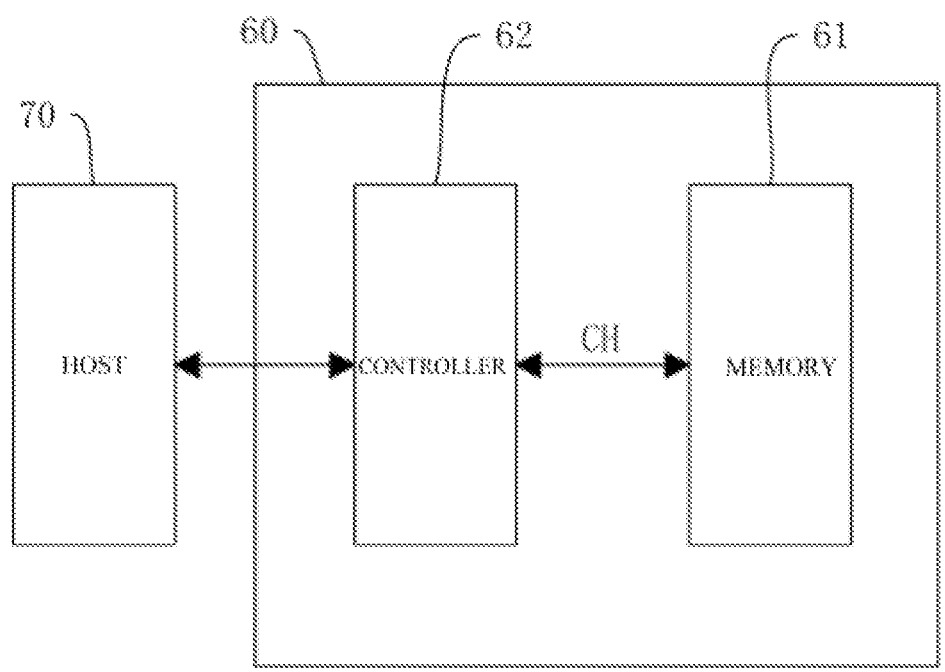
FIG. 6 is a structure view of a memory system provided in an implementation of the present disclosure.

Furthermore, an implementation of the present disclosure further provides a memory system. Referring to FIG. 6, the memory system 60 includes a controller 62 and a memory 61 in any one of the above-described implementations, wherein the controller 62 is coupled to the memory 61 and configured to control the memory 61 to store data.

In particular, the controller 62 may control the memory 61 via a channel CH and the memory 61 may execute operations based on the control by the controller 62 in response to the request from the host 70. The memory 61 may receive a command CMD and an address ADDR from the controller 62 through the channel CH and access regions selected from the memory array in response to the address. In other words, the memory 61 may execute internal operations corresponding to the command on the regions selected by the address.

In some implementations, the memory system 60 may be implemented as multimedia cards such as universal flash storage (UFS) device, solid state hard disk (SSD), MMC, eMMC, RS-MMC and mini-MMC, secure digital cards such as SD, mini-SD and micro-SD, storage devices of Personal Computer Memory Card International Association (PCMCIA) type, storage devices of peripheral component interconnect (PCI), storage devices of PCI Express (PCI-E) type, compact flash (CF) cards, smart media cards or memory sticks etc.

Specifically, the above-described memory system 60 may be used in terminal products such as computers, TVs, set-top boxes, on-vehicle device.

Further, an implementation of the present disclosure further provides an electronic device including the above-described memory system 60 provided in the implementations of the present disclosure. In particular, the electronic device may be any device that may store data such as a mobile phone, a desktop computer, a tablet computer, a notebook computer, a server, an on-vehicle device, a wearable device, a mobile power source, etc.

Since the memory system provided in implementations of the present disclosure is provided, the electronic device provided in the implementation of the present disclosure has the same beneficial effects as the above-described memory system.

In the above-described implementations, descriptions of implementations focused on respective aspects. For parts not described in detail in a certain implementation, related descriptions of other implementations may be referred to.

The memory and controlling method thereof, the memory system and the electronic device provided in implementations of the present disclosure have been described in detail above. The principles and implementations of the present disclosure have been set forth herein by using specific examples. The description of the above implementations is only for facilitating understanding the technical solution and the gist of the present disclosure. Those of ordinary skill in the art should appreciated that they can still make modifications to technical solutions recited in the above implementations or make equivalent substitutions to some technical features therein without departing from the scope of the technical solution of implementations of the present disclosure.

What is claimed is:

1. A memory, comprising:
 a semiconductor layer; and
 a memory array disposed on the semiconductor layer, the memory array including a plurality of memory strings connected with a same bit line, each of the memory strings including a memory cell and a select cell connected on at least one side of the memory cell,
 wherein the select cell includes a first kind of transistors with a first threshold voltage and a second kind of transistors with a second threshold voltage, the first kind of transistors are connected in series with the second kind of transistors, and the first threshold voltage is different from the second threshold voltage, and
 wherein the select cell is located between the semiconductor layer and the memory cell, at least one top transistor and first grooves are disposed on a first side of the memory cell away from the select cell, the memory includes a plurality of first memory sub-blocks arranged in a second direction parallel to the semiconductor layer, the first memory sub-block includes a plurality of the memory strings, the first grooves are arranged between adjacent two of the first memory sub-blocks in a third direction, and the third direction is parallel to the semiconductor layer and perpendicular to the second direction,
 wherein the select cell is located on a second side of the memory cell away from the semiconductor layer, the memory further includes at least one secondary transistor and second grooves disposed on a side of the select cell away from the memory cell, the secondary transistor is connected on the side of the select cell away from the memory cell, the memory includes a plurality of second memory sub-blocks arranged in the second direction, the second memory sub-block includes the plurality of the memory strings, and the second grooves are arranged between adjacent two of the second memory sub-blocks in the third direction, or
 wherein the select cells include first select cells located between the semiconductor layer and the memory cells and second select cells located on a third side of the memory cell away from the semiconductor layer, the memory further includes at least one secondary transistor and second grooves disposed on a side of the second select cell away from the memory cell, the secondary transistor is connected on the side of the second select cell away from the memory cell, the memory further includes a plurality of third memory sub-blocks arranged in the second direction, the third memory sub-blocks include the plurality of the memory strings, and the second grooves are arranged between adjacent two of the third memory sub-blocks in the third direction.

2. The memory of claim 1, wherein the memory strings extend in a first direction perpendicular to the semiconductor layer, the select cell is connected on at least one side of the memory cell in the first direction, and the first kind of transistors and the second kind of transistors are connected in the first direction, and
 wherein the first kind of transistors are turned on when their gate voltages are greater than a first voltage, the second kind of transistors are turned on when their gate voltages are greater than a second voltage, the first voltage is greater than the second voltage, the first threshold voltage is greater than the second voltage and less than the first voltage, and the second threshold voltage is less than the second voltage, such that the plurality of the memory strings are selectively turned on by the select cells.

3. The memory of claim 2, wherein the plurality of the memory strings include one on-state memory string in turned-on state and other off-state memory strings in turned-off state, the first kind of transistors and the second kind of transistors in the on-state memory string are all turned on, and at least one of the first kind of transistors in the off-state memory strings are turned off.

4. The memory of claim 3, wherein at least one of the first kind of transistors in the off-state memory strings and at least one of the second kind of transistors in the on-state memory string are connected with a same word line.

5. The memory of claim 1, wherein the select cell is located between the semiconductor layer and the memory cell, and the at least one top transistor and the first grooves are disposed on the first side of the memory cell away from the select cell, the at least one top transistor connecting a top select gate that is divided into a plurality of regions by the first grooves, and
 wherein the memory includes the plurality of first memory sub-blocks arranged in the second direction, the first memory sub-block includes the plurality of the memory strings, and the first grooves are arranged between adjacent two of the first memory sub-blocks in the third direction.

6. The memory of claim 1, wherein the select cell is located on the second side of the memory cell away from the semiconductor layer, the memory further includes the at least one secondary transistor and the second grooves disposed on the side of the select cell away from the memory cell, the second grooves separating secondary select gates corresponding to the second transistor, and the secondary transistor is connected on the side of the select cell away from the memory cell, and wherein the memory includes the plurality of second memory sub-blocks arranged in the second direction, the second memory sub-block includes the plurality of the memory strings, and the second grooves are arranged between adjacent two of the second memory sub-blocks in the third direction.

7. The memory of claim 1, wherein the select cells include the first select cells located between the semiconductor layer and the memory cells and the second select cells located on the third side of the memory cell away from the semiconductor layer, the memory further includes the at least one secondary transistor and the second grooves disposed on the side of the second select cell away from the memory cell, the second grooves separating secondary select gates corresponding to the second transistor, and the secondary transistor is connected on the side of the second select cell away from the memory cell, and wherein the memory further includes the plurality of third memory sub-blocks arranged in the second direction, the third memory sub-blocks include the plurality of the memory strings, and the second grooves are arranged between adjacent two of the third memory sub-blocks in the third direction.

8. The memory of claim 1, wherein a number of the plurality of memory strings connected with the same bit line is greater than $2^{1-1}$ and less than or equal to $2^n$, n is a positive integer greater than or equal to 1, and a sum of a number of the first kind of transistors and a number of the second kind of transistors in the select cells of each of the memory strings is greater than or equal to 2n.

9. The memory of claim 8, wherein a number of the first kind of transistors in the select cells equals to a number of the second kind of transistors.

10. A memory system, comprising:
a memory, the memory comprising:
a semiconductor layer; and
a memory array disposed on the semiconductor layer, the memory array including a plurality of memory strings connected with a same bit line, each of the memory strings including a memory cell and a select cell connected on at least one side of the memory cell,
wherein the select cell includes a first kind of transistors with a first threshold voltage and a second kind of transistors with a second threshold voltage, the first kind of transistors are connected in series with the second kind of transistors, and the first threshold voltage is different from the second threshold voltage, and
wherein the select cell is located between the semiconductor layer and the memory cell, at least one top transistor and first grooves are disposed on a first side of the memory cell away from the select cell, the memory includes a plurality of first memory sub-blocks arranged in a second direction parallel to the semiconductor layer, the first memory sub-block includes a plurality of the memory strings, the first grooves are arranged between adjacent two of the first memory sub-blocks in a third direction, and the third direction is parallel to the semiconductor layer and perpendicular to the second direction,
wherein the select cell is located on a second side of the memory cell away from the semiconductor layer, the memory further includes at least one secondary transistor and second grooves disposed on a side of the select cell away from the memory cell, the secondary transistor is connected on the side of the select cell away from the memory cell, the memory includes a plurality of second memory sub-blocks arranged in the second direction, the second memory sub-block includes the plurality of the memory strings, and the second grooves are arranged between adjacent two of the second memory sub-blocks in the third direction, or wherein the select cells include first select cells located between the semiconductor layer and the memory cells and second select cells located on a third side of the memory cell away from the semiconductor layer, the memory further includes at least one secondary transistor and second grooves disposed on a side of the second select cell away from the memory cell, the secondary transistor is connected on the side of the second select cell away from the memory cell, the memory further includes a plurality of third memory sub-blocks arranged in the second direction, the third memory sub-blocks include the plurality of the memory strings, and the second grooves are arranged between adjacent two of the third memory sub-blocks in the third direction; and a controller coupled to the memory and configured to control the memory to store data.

11. The memory system of claim 10, wherein the memory strings extend in a first direction perpendicular to the semiconductor layer, the select cell is connected on at least one side of the memory cell in the first direction, and the first kind of transistors and the second kind of transistors are connected in the first direction, and wherein the first kind of transistors are turned on when their gate voltages are greater than a first voltage, the second kind of transistors are turned on when their gate voltages are greater than a second voltage, the first voltage is greater than the second voltage, the first threshold voltage is greater than the second voltage and less than the first voltage, and the second threshold voltage is less than the second voltage, such that the plurality of the memory strings are selectively turned on by the select cells.

12. A controlling method for a memory, the memory including a semiconductor layer and a memory array, the memory array disposed on the semiconductor layer and including a plurality of memory strings connected with a same bit line, each of the memory strings including a memory cell and a select cell connected on at least one side of the memory cell, the select cell including a first kind of transistor with a first threshold voltage and a second kind of transistor with a second threshold voltage different from the first threshold voltage, the first kind of transistor being connected in series with the second kind of transistor, wherein the select cell is located between the semiconductor layer and the memory cell, at least one top transistor and first grooves are disposed on a first side of the memory cell away from the select cell, the memory includes a plurality of first memory sub-blocks arranged in a second direction parallel to the semiconductor layer, the first memory sub-block includes a plurality of the memory strings, the first grooves are arranged between adjacent two of the first memory sub-blocks in a third direction, and the third direction is parallel to the semiconductor layer and perpendicular to the second direction, wherein the select cell is located on a second side of the memory cell away from the semiconductor layer, the memory further includes at least one secondary transistor and second grooves disposed on a side of the select cell away from the memory cell, the secondary transistor is connected on the side of the select cell away from the memory cell, the memory includes a plurality of second memory sub-blocks arranged in the second direction, the second memory sub-block includes the plurality of the memory strings, and the second grooves are arranged between adjacent two of the second memory sub-blocks in the third direction, or wherein the select cells include first select cells located between the semiconductor layer and the memory cells and second select cells located on a third side of the memory cell away from the semiconductor layer, the memory further includes at least one secondary transistor and second grooves disposed on a side of the second select cell away from the memory cell, the secondary transistor is connected on the side of the second select cell away from the memory cell, the memory further includes a plurality of third memory sub-blocks arranged in the second direction, the third memory sub-blocks include the plurality of the memory strings, and the second grooves are arranged between adjacent two of the third memory sub-blocks in the third direction, the controlling method comprising:
applying different voltages to the first kind of transistors and the second kind of transistors to select and turn on a memory string as a driven memory string from the plurality of memory strings.

13. The controlling method of claim 12, wherein the memory strings extend in a first direction perpendicular to the semiconductor layer, the select cell is connected on at least one side of the memory cell in the first direction, and the first kind of transistors and the second kind of transistors are connected in the first direction, and applying different voltages to the first kind of transistors and the second kind of transistors includes:
applying a first voltage to the first kind of transistors in the driven memory string, applying a second voltage to the second kind of transistors in the driven memory string, and applying the second voltage to at least one the first kind of transistors in memory strings other than the driven memory string among the plurality of memory strings such that the driven memory string is an on-state memory string, wherein the memory strings other than the driven memory string among the plurality of memory strings are off-state memory strings, the first voltage is greater than the second voltage, the first threshold voltage is greater than the second voltage and less than the first voltage, and the second threshold voltage is less than the second voltage.

14. The controlling method of claim 13, wherein at least one of the first kind of transistors in the off-state memory strings and at least one of the second kind of transistors in the on-state memory string are connected with a same word line.

15. The memory system of claim 10, wherein the select cell is located between the semiconductor layer and the memory cell, and the at least one top transistor and the first grooves are disposed on the first side of the memory cell away from the select cell, the at least one top transistor connecting a top select gate that is divided into a plurality of regions by the first grooves, and wherein the memory includes the plurality of first memory sub-blocks arranged in the second direction, the first memory sub-block includes the plurality of the memory strings, and the first grooves are arranged between adjacent two of the first memory sub-blocks in the third direction.

16. The memory system of claim 10, wherein the select cell is located on the second side of the memory cell away from the semiconductor layer, the memory further includes the at least one secondary transistor and the second grooves disposed on the side of the select cell away from the memory cell, the second grooves separating secondary select gates corresponding to the second transistor, and the secondary transistor is connected on the side of the select cell away from the memory cell, and wherein the memory includes the plurality of second memory sub-blocks arranged in the second direction, the second memory sub-block includes the plurality of the memory strings, and the second grooves are arranged between adjacent two of the second memory sub-blocks in the third direction.

17. The memory system of claim 10, wherein the select cells include the first select cells located between the semiconductor layer and the memory cells and the second select cells located on the third side of the memory cell away from the semiconductor layer, the memory further includes the at least one secondary transistor and the second grooves disposed on the side of the second select cell away from the memory cell, the second grooves separating secondary select gates corresponding to the second transistor, and the secondary transistor is connected on the side of the second select cell away from the memory cell, and wherein the memory further includes the plurality of third memory sub-blocks arranged in the second direction, the third memory sub-blocks include the plurality of the memory strings, and the second grooves are arranged between adjacent two of the third memory sub-blocks in the third direction.

18. The controlling method of claim 12, wherein the select cell is located between the semiconductor layer and the memory cell, and the at least one top transistor and the first grooves are disposed on the first side of the memory cell away from the select cell, the at least one top transistor connecting a top select gate that is divided into a plurality of regions by the first grooves, and wherein the memory includes the plurality of first memory sub-blocks arranged in the second direction, the first memory sub-block includes the plurality of the memory strings, and the first grooves are arranged between adjacent two of the first memory sub-blocks in the third direction.

19. The controlling method of claim 12, wherein the select cell is located on the second side of the memory cell away from the semiconductor layer, the memory further includes the at least one secondary transistor and the second grooves disposed on the side of the select cell away from the memory cell, the second grooves separating secondary select gates corresponding to the second transistor, and the secondary transistor is connected on the side of the select cell away from the memory cell, and wherein the memory includes the plurality of second memory sub-blocks arranged in the second direction, the second memory sub-block includes the plurality of the memory strings, and the second grooves are arranged between adjacent two of the second memory sub-blocks in the third direction.

20. The controlling method of claim 12, wherein the select cells include the first select cells located between the semiconductor layer and the memory cells and the second select cells located on the third side of the memory cell away from the semiconductor layer, the memory further includes the at least one secondary transistor and the second grooves disposed on the side of the second select cell away from the memory cell, the second grooves separating secondary select gates corresponding to the second transistor, and the secondary transistor is connected on the side of the second select cell away from the memory cell, and
    wherein the memory further includes the plurality of third memory sub-blocks arranged in the second direction, the third memory sub-blocks include the plurality of the memory strings, and the second grooves are arranged between adjacent two of the third memory sub-blocks in the third direction.

\* \* \* \* \*